United States Patent
Garcia

(12) 
(10) Patent No.: US 6,535,388 B1
(45) Date of Patent: Mar. 18, 2003

(54) WIREBONDED MICROELECTRONIC PACKAGES INCLUDING HEAT DISSIPATION DEVICES FOR HEAT REMOVAL FROM ACTIVE SURFACES THEREOF

(75) Inventor: Jason A. Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/971,948

(22) Filed: Oct. 4, 2001

(51) Int. Cl.[7] ................................................ H05K 7/20
(52) U.S. Cl. ...................... 361/704; 361/699; 361/700; 361/707; 257/687; 257/704; 257/706; 257/707; 257/714; 257/715; 174/15.1; 174/15.2; 174/16.3; 165/80.3; 165/80.4
(58) Field of Search ................................. 361/689, 690, 361/699, 700, 702, 703, 704, 709; 257/675, 687, 704, 706, 707, 714, 715, 722; 174/15.1, 15.2, 16.1, 16.3; 165/80.3, 80.4, 185

(56) References Cited

U.S. PATENT DOCUMENTS

| | | | | |
|---|---|---|---|---|
| 5,130,889 A | * | 7/1992 | Hamburgen et al. | 165/80.3 |
| 5,455,457 A | * | 10/1995 | Kurokawa | 257/712 |
| 5,880,524 A | * | 3/1999 | Xie | 257/704 |
| 6,029,343 A | * | 2/2000 | Wieloch | 29/830 |
| 6,084,297 A | * | 7/2000 | Brooks et al. | 257/698 |
| 6,087,682 A | * | 7/2000 | Ando | 257/178 |
| 6,146,921 A | | 11/2000 | Barrow | |
| 6,163,458 A | * | 12/2000 | Li | 361/704 |

* cited by examiner

*Primary Examiner*—Boris Chervinsky
(74) *Attorney, Agent, or Firm*—Blakely, Sokoloff, Taylor & Zafman LLP

(57) ABSTRACT

A wirebonded microelectronic package including a microelectronic die attached by a back surface to a mounting surface of a recess formed in a substrate and a heat dissipation device thermally contacting said microelectronic die active surface. A plurality of bond wires electrically connects bond pads on the microelectronic die active surface to a plurality of corresponding traces within the recess.

15 Claims, 5 Drawing Sheets

WIREBONDED MICROELECTRONIC PACKAGES INCLUDING HEAT DISSIPATION DEVICES FOR HEAT REMOVAL FROM ACTIVE SURFACES THEREOF

BACKGROUND OF THE INVENTION

1. Field of the Invention

The present invention relates to apparatus and methods for the removal of heat from electronic devices. In particular, the present invention relates to a heat sink for the removal of heat from an active surface of a wirebonded microelectronic die.

2. State of the Art

Microelectronic dice are typically housed in a protective covering referred to as a package or packaging. In one such package 200, as shown in FIGS. 6 and 7, a microelectronic die 202 is positioned in a recess 204 of a substrate 206. The microelectronic die 202 contains integrated circuitry formed therein (not shown). A back surface 208 of the microelectronic die 202 is preferably attached in the substrate recess 204 by a first layer of adhesive 212. A plurality of bond pads 214 is disposed on an active surface 216 of the microelectronic die 202, as shown in FIG. 7. The bond pads 214 are generally placed near the edges of the microelectronic die active surface 216 and are electrically connected by bond wires 218 to corresponding conductive fingers or traces 222 on the substrate 206.

Generally, portions of the conductive traces 222 are disposed on multiple tiers in the substrate recess 204 (shown as first tier 224 and second tier 226) for more effective attachment of the bond wires 218. The substrate 206 usually comprises a layer or multiple layers of dielectric material with the conductive traces 222 extending therethrough and/or therebetween (not shown), wherein the conductive traces 222 are in contact with external electrically connection devices, such as solder ball or pins (not shown), which may connect the package 200 to external electrical devices.

A lid 228 covers the recess 204 and may be attached to a first surface 232 of the substrate by a second layer of adhesive 234. The lid 228 prevents environmental contamination of the microelectronic die 202, the bond pads 214, the bond wires 218, and/or the conductive traces 222, which may lead to the damage or destruction thereof.

In another embodiment as shown in FIG. 8, an encapsulant material 236 may be disposed in the substrate recess 204 to prevent environmental contamination, rather than the attachment of a lid 228, as shown in FIG. 6.

Of course, higher performance, lower cost, increased miniaturization, and greater packaging density of integrated circuits are ongoing goals of the computer industry. As these goals are achieved, microelectronic dice 202 become smaller. Accordingly, the density of power consumption of the integrated circuit components in the microelectronic die 202 has increased, which, in turn, increases the average junction temperature of the microelectronic die 202. If the temperature of the microelectronic die 202 becomes too high, the integrated circuits of the microelectronic die 202 may be damaged or destroyed. Generally, with surface mounted microelectronic dice, such as flip-chips and quad flat packs, heat is dissipated from the back surface thereof with the attachment of heat slugs, heat pipes, heat spreaders, and the like. With wirebonded microelectronic die packages described above, heat also can be drawn out of a back surface 238 of the package 200 through the substrate 206 with the attachment of a heat dissipation device. However, the substrate 206 is general made of an organic laminate, which is a poor thermal conductor. Thus, in some cases, the substrate 206 may be made of a thermally conductive ceramic or may have an integrated heat dissipation device 242 to draw heat out of the microelectronic die back surface 208, as shown in FIG. 9.

However, as thermal management issues continue to arise, it would be advantageous to develop apparatus and techniques to effectively remove additional heat from a wirebonded microelectronic dice while requiring minimal changes to the current wirebond package process.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
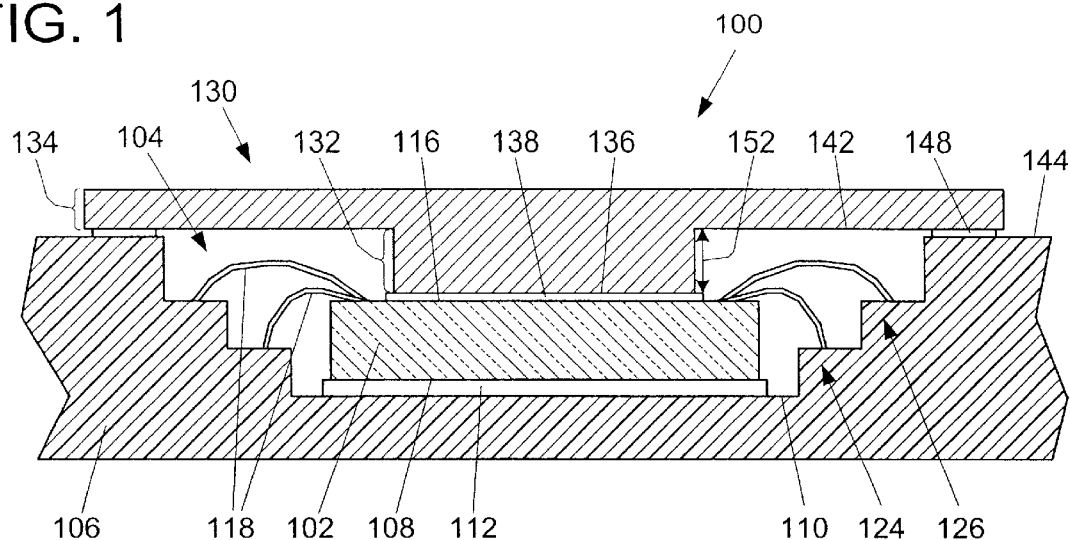
FIG. 1 is a side cross-sectional view of a first embodiment of a heat dissipation device attached to a microelectronic die, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 illustrates a wirebonded microelectronic assembly 100 of the present invention. The basic structure of the wirebonded microelectronic assembly 100 is similar to that previously described in relation to FIGS. 6–9, and comprises a microelectronic die 102 positioned in a recess 104 of a dielectric substrate 106. The microelectronic die 102 contains integrated circuitry formed therein (not shown) and may comprise, but is not limited to a microprocessor, a chipset, an ASIC, a memory device, or the like.

Figure 2:
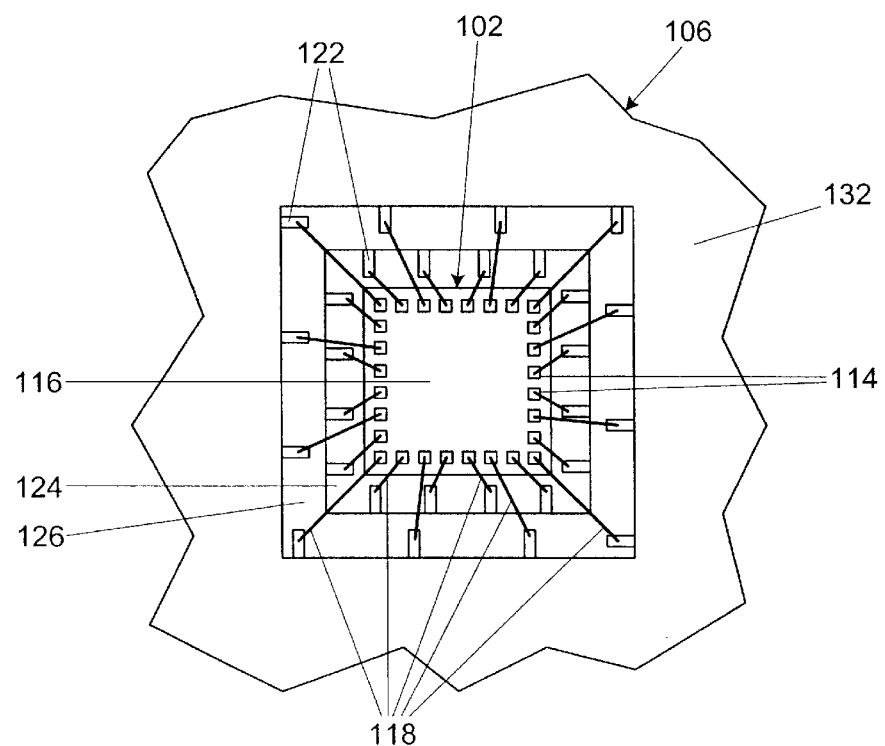
FIG. 2 is a top plan view of the wirebonded microelectronic die package without the heat dissipation device, according to the present invention.

A back surface 108 of the microelectronic die 102 is preferably attached to a mounting surface 110 in the substrate recess 104 by a first layer of adhesive material 112, including, but not limited to, epoxy, solder (tin/silver, lead/tin, and the like), and other such adhesive materials known in the art. As shown in FIG. 2, a plurality of bond pads 114 is disposed on an active surface 116 of the microelectronic die 102. The bond pads 114 are generally placed near the edges of the microelectronic die active surface 116 (e.g., the periphery thereof) and are electrically connected by bond wires 118 to corresponding conductive fingers or traces 122 (see FIG. 2) disposed on a first tier 124 and a second tier 126 of the substrate 106. Although the substrate 106 is illustrated with a first tier 124 and a second tier 126, the present invention is not so limited. The substrate 106 may have any number of tiers. Also, the conductive traces 122 may reside on the recess mounting surface 110, as will be understood to those skilled in the art.

A heat dissipation device 130 is attached to the microelectronic die active surface 116. The heat dissipation device 130, as shown in FIG. 1, acts as both a heat dissipation device and a lid, and is preferably made of a highly thermally conductive material, including but not limited to copper, copper alloys, aluminum, aluminum alloys, diamond carbide, and the like. The heat dissipation device 130 includes a pedestal portion 132 and a capping portion 134. A contact surface 136 of the heat dissipation device pedestal portion 132 is in thermal contact with the microelectronic die active surface 116 through a thermal interface material 138 disposed therebetween. Thus, as will be evident, the heat dissipation device pedestal portion 132 should be configured to contact the thermal interface material 138 without interfering with the bond pads 114 and/or the bond wires 118. Furthermore, the thermal interface material 138 should be applied such that it also does not interfere with or compromise the integrity of the bond pads 114 and/or the bond wires 118. Moreover, the thickness of the thermal interface material 138 may vary, but if that the thermal interface material has a lower thermal conductivity than the heat dissipation device 130, the thickness of the thermal interface material should be as small as the reliability requirement will allow for optimal performance. The thermal interface material 138 should have high thermal conductivity and may include, but is not limited to, thermal grease, phase-change material, metal filled polymer matrix, solder (alloys of lead, tin, indium, silver, copper, and the like), and other such materials known in the art.

An attachment surface 142 of the heat dissipation device capping portion 134 is attached to a first surface 144 of the substrate 106 by a second layer of adhesive material 148. The second adhesive material layer 148 may include, but is not limited to epoxy, solder (tin/silver, lead/tin, and the like), and other such adhesive materials known in the art. Preferably, the heat dissipation device capping portion 134 extends over the substrate first surface 144 completely around the recess 104 and the second adhesive material layer 148 attaches the heat dissipation device capping portion 134 completely around the recess 104. Thus, the recess 104 is substantially sealed from potential contamination of the microelectronic die 102, the bond pads 114, the bond wires 118, and/or the conductive traces 122, which may lead to the damage or destruction thereof.

As it will be evident to those skilled in the art, the height 152 of the heat dissipation device pedestal portion 132 will depend on several factors, including the thickness of the first adhesive material layer 112, the thickness of the thermal interface material 138, the depth of the recess 104, and the thickness of the second adhesive material layer 148. Additionally, thickness of the heat dissipation device capping portion 134 can be modified to optimize the thermal performance of the heat dissipation device 130.

Furthermore, as shown in FIG. 2, the heat dissipation device capping portion 134 may also include a plurality of thermally conductive projections 154 extending therefrom. The projections 154 increase the surface area of the heat dissipation device 130, thereby improving the convective heat dissipation therefrom, and may comprise columns, fins, or the like. Moreover, the heat dissipation device pedestal portion 132 may include a vapor chamber 156. The vapor chamber 156 comprises a chamber containing a working fluid 162, such as water or alcohol. The vapor chamber 156 is preferably under a low-pressure atmosphere or partial vacuum. The working fluid 162 is generally in a liquid phase proximate the heat source, i.e., the microelectronic die 102. As the microelectronic die 102 heats under normal operation, the temperature of the working fluid 162 within the vapor chamber 156 is increased, resulting in the evaporation of the working fluid 162 to form a gaseous phase. As the gaseous phase moves toward an upper surface(s) 164 of the vapor chamber 112, it condenses to again form the liquid phase of the working fluid 162, thereby releasing the heat absorbed during the evaporation of the liquid phase of the working fluid 162. The liquid phase returns, by gravity, to a lower surface 166 of the vapor chamber 156 proximate the microelectronic die 102, wherein the process is repeated. Thus, the vapor chamber 156 is able to rapidly transfer heat away from the microelectronic die 102 to the heat dissipation device capping portion 134 for dissipation of the heat to the surrounding air.

Figure 3:
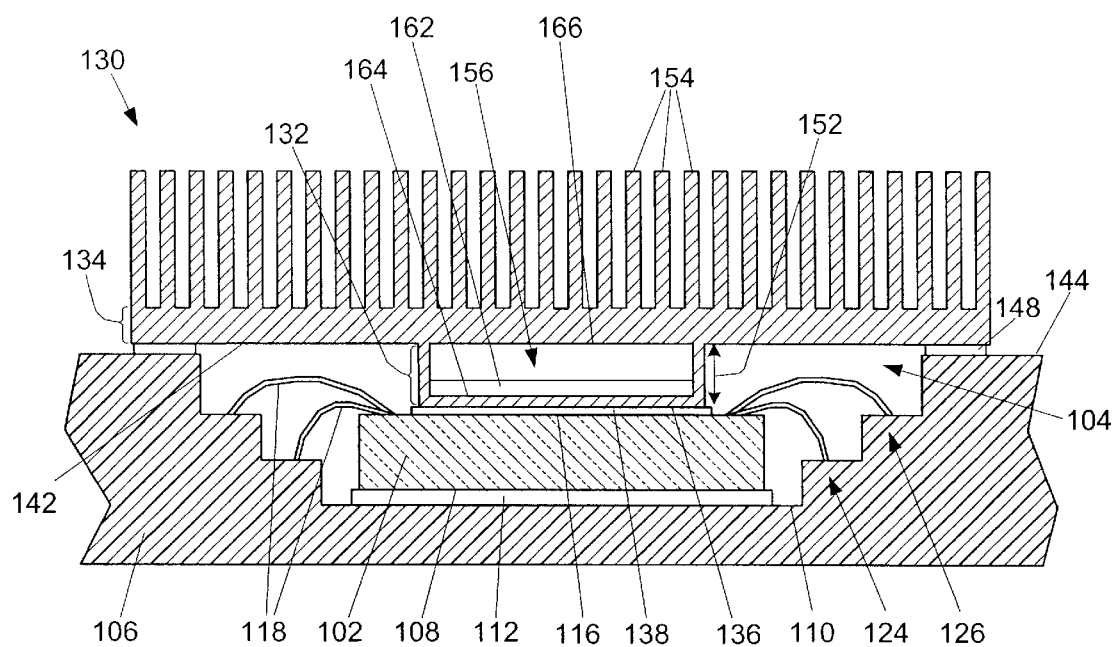
FIG. 3 is a side cross-sectional view of a second embodiment of a heat dissipation device attached to a microelectronic die, according to the present invention.

FIG. 3 illustrates another embodiment of the wirebonded microelectronic assembly 170 of the present invention. The basic structure of the wirebonded microelectronic assembly 170 is similar to that described in relation to FIGS. 1 and 2, and comprises the back surface 108 of the microelectronic die 102 attached by the first adhesive material layer 112 to the mounting surface 110 of the recess 104 of the dielectric substrate 106. The bond pads 114 on an active surface 116 of the microelectronic die 102 and are electrically connected by the bond wires 118 to corresponding conductive fingers or traces 122 disposed on the first tier 124 and the second tier 126 of the substrate 106.

A heat dissipation device, such as a heat slug 172, is attached to the microelectronic die active surface 116 and is preferably made of a highly thermally conductive material, including but not limited to copper, copper alloys, aluminum, aluminum alloys, diamond carbide, and the like. A contact surface 174 of the heat slug 172 is in thermal contact with the microelectronic die active surface 116 through the thermal interface material 138 disposed therebetween. The heat slug 172 should be configured to contact the thermal interface material 138 without interfering with the bond pads 114 and/or the bond wires 118. Furthermore, the thermal interface material 138 should be applied such that it also does not interfere with or compromise the integrity of the bond pads 114 and/or the bond wires 118.

An underfill or encapsulation material 176, such as an plastics, resins, epoxies, and the like, is disposed within the recess 104 to protect the microelectronic die 102, the bond pads 114, the bond wires 118, and/or the conductive traces 122. The height 178 of the heat slug 172 can vary. However, it is preferred that the heat slug 172 be high enough to prevent the encapsulation material 176 from covering a back side 182 of the heat slug 172, which would decrease heat dissipation therefrom.

Figure 4:
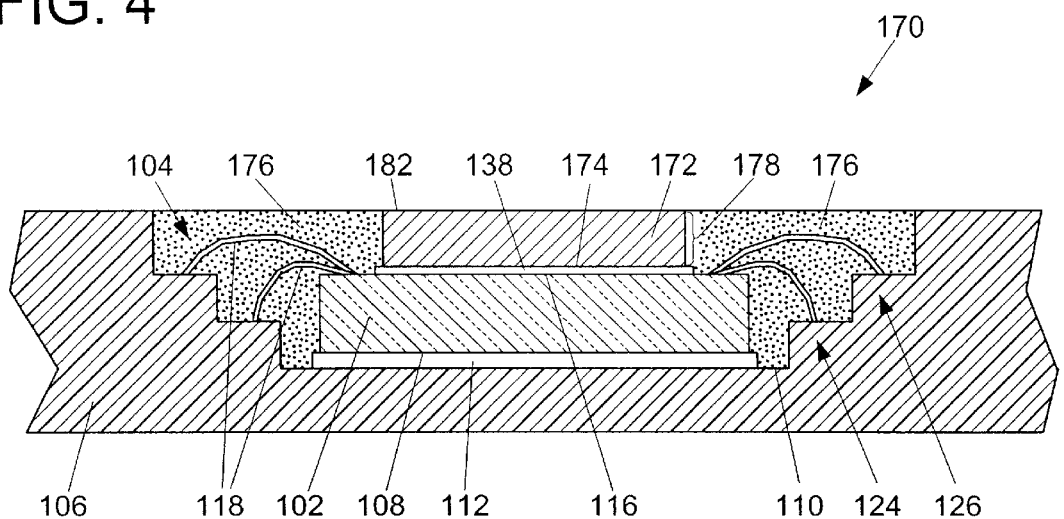
FIG. 4 is a side cross-sectional view of a third embodiment of a heat dissipation device attached to a microelectronic die, according to the present invention.
Figure 5:
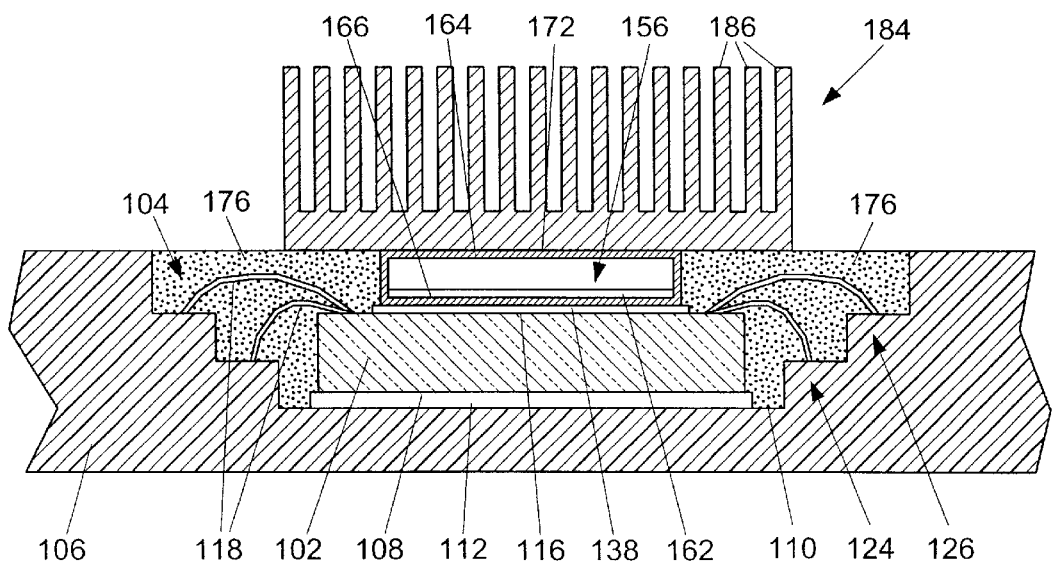
FIG. 5 is a side cross-sectional view of a fourth embodiment of a heat dissipation device attached to a microelectronic die, according to the present invention.
Figure 6:
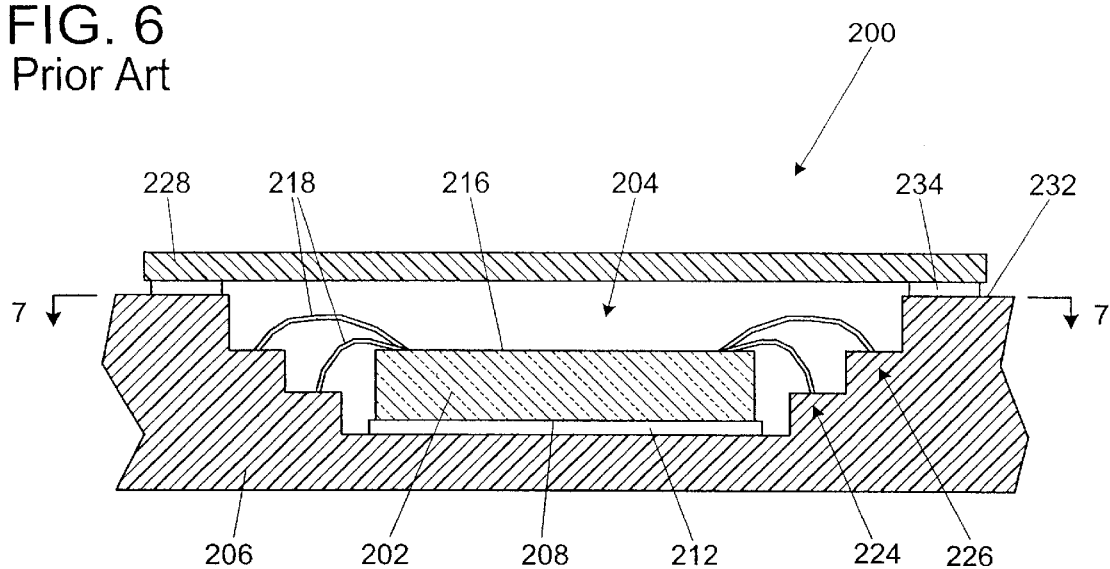
FIG. 6 is a side cross-sectional view of a wirebonded microelectronic die package, as known in the art.
Figure 7:
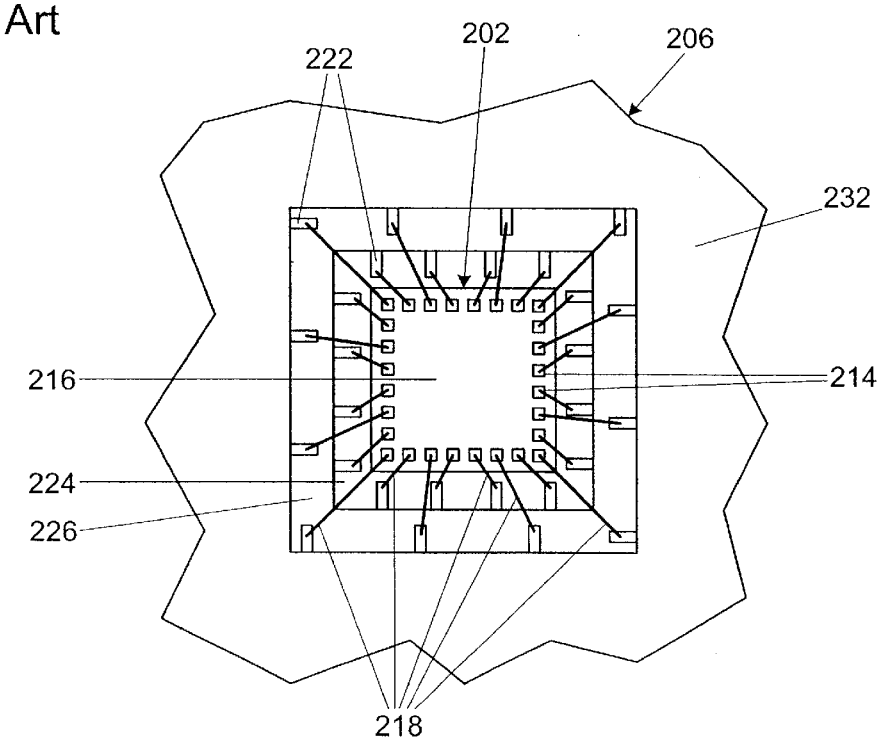
FIG. 7 is a top plan view of the wirebonded microelectronic die package along lines 7—7 of FIG. 6, as known in the art.
Figure 8:
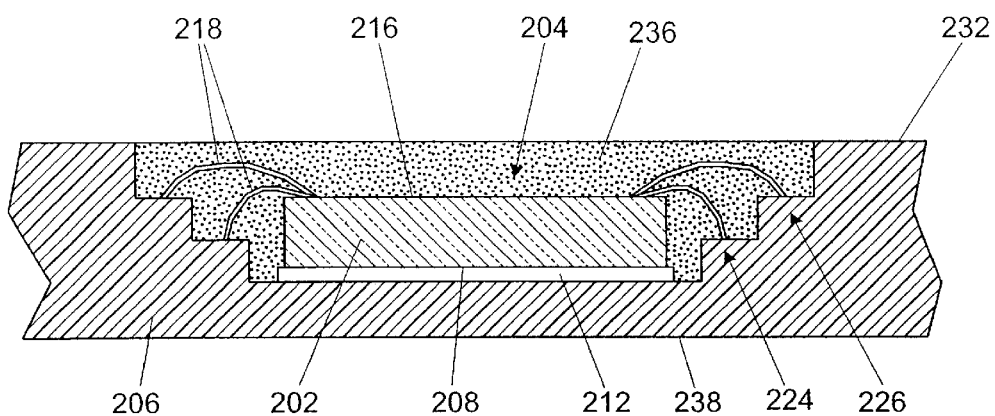
FIG. 8 is a side cross-sectional view of another embodiment wirebonded microelectronic die package, as known in the art.
Figure 9:
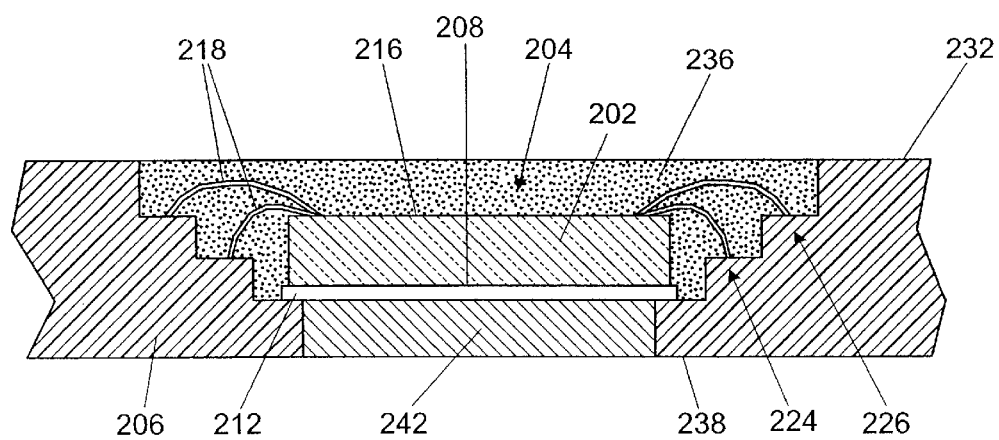
FIG. 9 is a side cross-sectional view of still another wirebonded microelectronic die package, as known in the art.

Furthermore, as shown in FIG. 4, a high surface area heat dissipation device 184, include a plurality of thermally conductive projections 186 extending therefrom, may be thermally attached to the heat slug 172. Moreover, the heat slug 172 may include a vapor chamber 156, as describe above in relation to FIG. 2.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a substrate having a recess extending into said substrate from a first surface thereof;
   a microelectronic die having an active surface and a back surface, said microelectronic die disposed within said recess with said microelectronic die back surface attached to a mounting surface within said recess;
   a heat dissipation device thermally contacting said microelectronic die active surface; and
   an encapsulation material disposed within said recess.

2. The microelectronic package of claim 1, further including a plurality of bond wires electrically connecting bond pads on said microelectronic die active surface to a plurality of corresponding traces within the recess.

3. The microelectronic package of claim 2, further including at least one tier within said recess, wherein at least a portion of said plurality of traces reside on said at least one tier.

4. The microelectronic package of claim 1, further including a thermal interface material disposed between said heat dissipation device and said microelectronic die active surface.

5. The microelectronic package of claim 1, wherein said heat dissipation device comprises a heat slug.

6. The microelectronic package of claim 5, wherein said heat slug further includes a vapor chamber disposed therein.

7. The microelectronic package of claim 5, further including a high surface area heat dissipation device in thermal contact with said heat slug.

8. The microelectronic package of claim 1, wherein said heat dissipation device comprises a pedestal portion in thermal contact with said microelectronic die active surface and a capping portion attached to said substrate first surface.

9. The microelectronic package of claim 7, wherein said heat dissipation device pedestal portion includes a vapor chamber disposed therein.

10. The microelectronic package of claim 7, further including a plurality of thermally conductive projections extending from said heat dissipation device capping portion.

11. A microelectronic package, comprising:
    a substrate having a recess defined therein extending into said substrate from a first surface thereof;
    a microelectronic die having an active surface and a back surface, said microelectronic die disposed within said recess with said microelectronic die back surface attached to a mounting surface of said recess;
    a heat dissipation device comprising a pedestal portion in thermal contact with said microelectronic die active surface and a capping portion attached to said substrate first surface; and
    a vapor chamber disposed within said heat dissipation device pedestal portion.

12. The microelectronic package of claim 11, further including a plurality of bond wires electrically connecting bond pads on said microelectronic die active surface to a plurality of corresponding traces within the recess.

13. The microelectronic package of claim 12, further including at least one tier within said recess, wherein at least a portion of said plurality of traces reside on said at least one tier.

14. The microelectronic package of claim 11, further including a thermal interface material disposed between said heat dissipation device and said microelectronic die active surface.

15. The microelectronic package of claim 11, further including a plurality of thermally conductive projections extending from said heat dissipation device capping portion.

* * * * *

UNITED STATES PATENT AND TRADEMARK OFFICE
CERTIFICATE OF CORRECTION

PATENT NO.    : 6,535,388 B1                                              Page 1 of 1
DATED         : March 18, 2003
INVENTOR(S)   : Jason A. Garcia It is certified that error appears in the above-identified patent and that said Letters Patent is hereby corrected as shown below:

<u>Column 4,</u>
Line 8, delete "scaled", insert -- sealed --.

Signed and Sealed this

Second Day of September, 2003

JAMES E. ROGAN
*Director of the United States Patent and Trademark Office*